United States Patent
Zhong et al.

(10) Patent No.: US 12,020,932 B2
(45) Date of Patent: Jun. 25, 2024

(54) PHOTORESIST COATING METHOD

(71) Applicant: United Semiconductor (Xiamen) Co., Ltd., Fujian (CN)

(72) Inventors: Shi Teng Zhong, Shamen (CN); Ching-Shu Lo, Singapore (SG); Yuan-Chi Pai, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 17/948,214

(22) Filed: Sep. 19, 2022

(65) Prior Publication Data
US 2024/0063017 A1    Feb. 22, 2024

(30) Foreign Application Priority Data
Aug. 16, 2022    (CN) .......................... 202210979100.8

(51) Int. Cl.
*G03F 7/16*    (2006.01)
*H01L 21/027*    (2006.01)

(52) U.S. Cl.
CPC .......... *H01L 21/0274* (2013.01); *G03F 7/162* (2013.01)

(58) Field of Classification Search
CPC ....................................................... G03F 7/162
See application file for complete search history.

(56) References Cited

U.S. PATENT DOCUMENTS

| | | | |
|---|---|---|---|
| 5,968,592 A | 10/1999 | Yoshida | |
| 8,927,058 B2 | 1/2015 | Huang | |
| 2006/0223336 A1 | 10/2006 | Wei | |
| 2014/0065843 A1* | 3/2014 | Chang | H01L 21/6715 438/782 |

* cited by examiner

*Primary Examiner* — James M Mellott
(74) *Attorney, Agent, or Firm* — Winston Hsu

(57) ABSTRACT

The invention provides a photoresist coating method, which comprises the following steps: providing a wafer with a pattern on the wafer, placing the wafer on a spinner, injecting a photoresist on a central region of the wafer from a nozzle, and carrying out a spin coating step, the spin coating step comprises: turning on the spinner to rotate the spinner to a first rotation speed, and raising the first rotation speed to a second rotation speed, and performing a plurality of brakes during the process of maintaining the second rotation speed, so that the second rotation speed instantly drops to a third rotation speed, and then rises to the second rotation speed again.

8 Claims, 4 Drawing Sheets

PHOTORESIST COATING METHOD

BACKGROUND OF THE INVENTION

1. Field of the Invention

The invention relates to the field of semiconductor manufacturing, in particular to a photoresist coating method, which is helpful to improve the uniformity of photoresist coating.

2. Description of the Prior Art

Photoresist coating is one of the commonly used techniques in semiconductor manufacturing. When it is necessary to form a desired pattern on a material layer, a photomask is usually used to perform photolithography steps (including photoresist coating, exposure, development, etching, etc.). Therefore, the uniformity of photoresist coating will obviously affect the yield of semiconductor process. For example, when the surface of some material layers has a special shape, it is easy to cause the photoresist to not completely cover the whole wafer during spin coating. If part of the wafer is not covered by photoresist, the subsequent pattern cannot be formed at that position, which has a great influence on the yield of semiconductor manufacturing process.

SUMMARY OF THE INVENTION

The invention provides a photoresist coating method, which comprises the following steps: providing a wafer with a pattern on it, placing the wafer on a photoresist spin coater, injecting a photoresist on a central region of the wafer from a nozzle, and performing a spin coating step, wherein the spin coating step comprises: turning on the photoresist spin coater to make the photoresist spin coater rotate to a first rotation speed, increasing the first rotation speed to a second rotation speed, and performing multiple rapid braking in the process of maintaining the second rotation speed, so that the second rotation speed instantly drops to a third rotation speed.

The invention is characterized in that when the photoresist is spin-coated, the photoresist is deliberately moved like a wave by changing the rotation speed, which can greatly solve the problem that the photoresist cannot cover some areas of the wafer. Especially for some patterns with special shapes (such as continuous right-angled wires, etc.), the uniformity of photoresist coating process can be greatly increased. In the prior art, when photoresist is coated on a complex pattern, it is difficult to completely cover the whole wafer surface even if the photoresist injecting amount is increased. By the method provided by the invention, the photoresist can completely cover the whole wafer across obstacles without increasing the photoresist injecting amount, and the yield of photoresist spin coating is effectively improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

In the conventional spin coating process, the photoresist liquid is sprayed on the center of the wafer, and then the wafer is rotated, so that the photoresist can be spread from the center to the outside by centrifugal force, and the photoresist can be evenly coated on the whole wafer surface. Besides, the film thickness of the photoresist can be adjusted by controlling the rotation speed. However, in the conventional spin coating process, if the patterns composed of various material layers have been formed on the wafer surface, these patterns may affect the photoresist coating process. For example, some patterns are thicker, which will block part of the photoresist and prevent the photoresist from being completely distributed to the whole wafer, thus affecting the yield of the semiconductor process.

Figure 1:
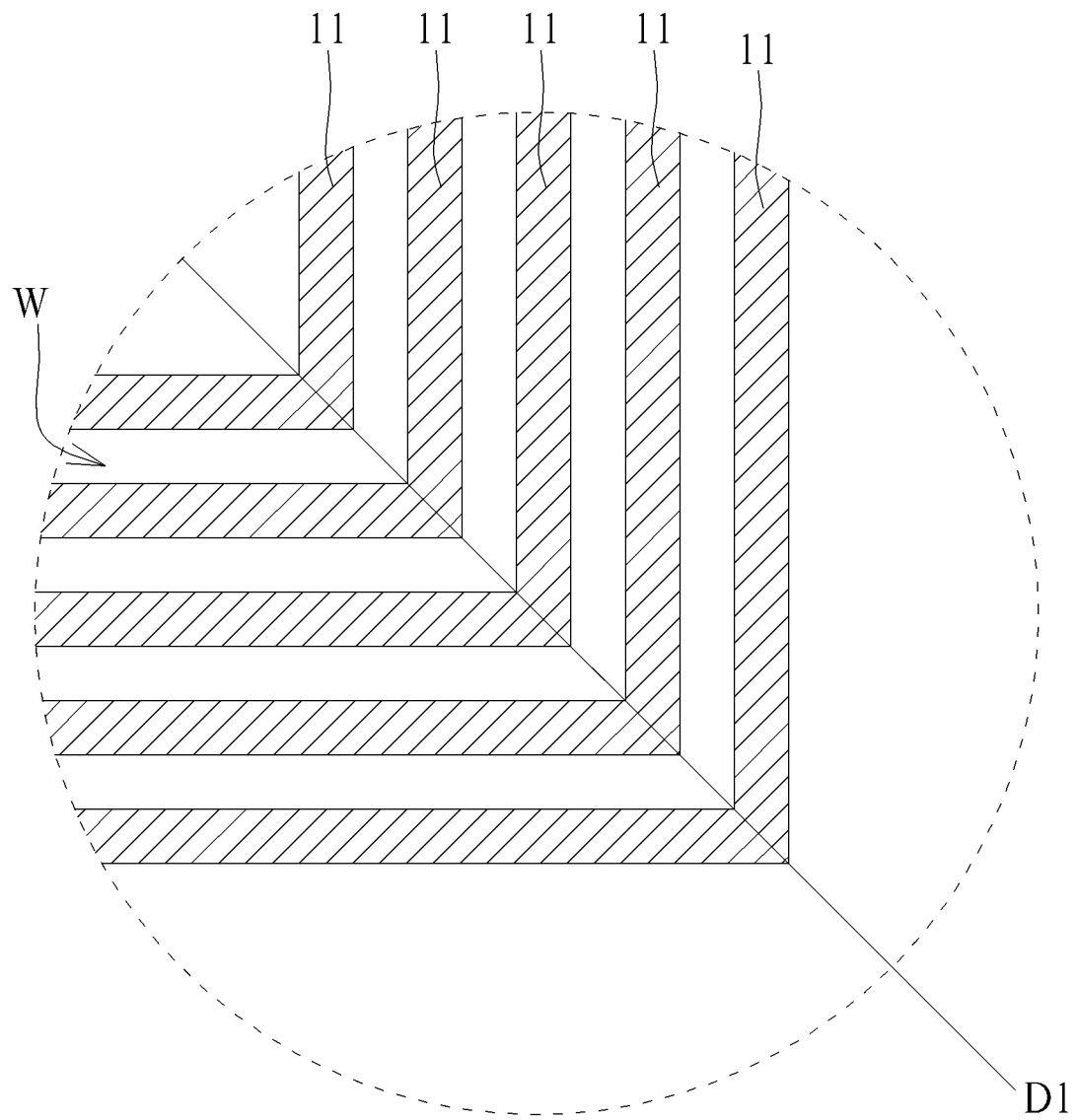
FIG. 1 shows the pattern of material layer distribution on the surface of a wafer to which the method of spin coating photoresist according to the present invention is applicable.

For example, FIG. 1 shows the distribution pattern of the material layer on the surface of a wafer to which the spin coating photoresist method of the present invention is applicable. As shown in FIG. 1, FIG. 1 depicts a partial surface diagram of a wafer W, in which a pattern 11 is formed on the surface of the wafer W. Taking this embodiment as an example, the pattern 11 is a metal line (metal trace). It is worth noting that the pattern 11 of this embodiment presents a plurality of right angles (or included angles), and each right angle is aligned along a direction (such as the direction D1 in FIG. 1). However, according to the applicant's experimental results, when a pattern similar to the above is spin-coated with photoresist, most of the photoresist may be stuck in the right angle, so it is not easy to spread out, resulting in uneven photoresist coating, especially the area next to the right angle may not be covered by the photoresist, thus resulting in the incomplete formation of the subsequent pattern on the wafer W.

In addition to the above patterns with a plurality of continuous right angles, the applicant found that when the density of the pattern occupying the photoresist is high (for example, the area ratio of the pattern accounts for more than 60% of the total area), or when the aspect ratio of the pattern is high (for example, there are deep and narrow grooves, and the aspect ratio is larger than 10), the photoresist may be stuck.

Figure 2:
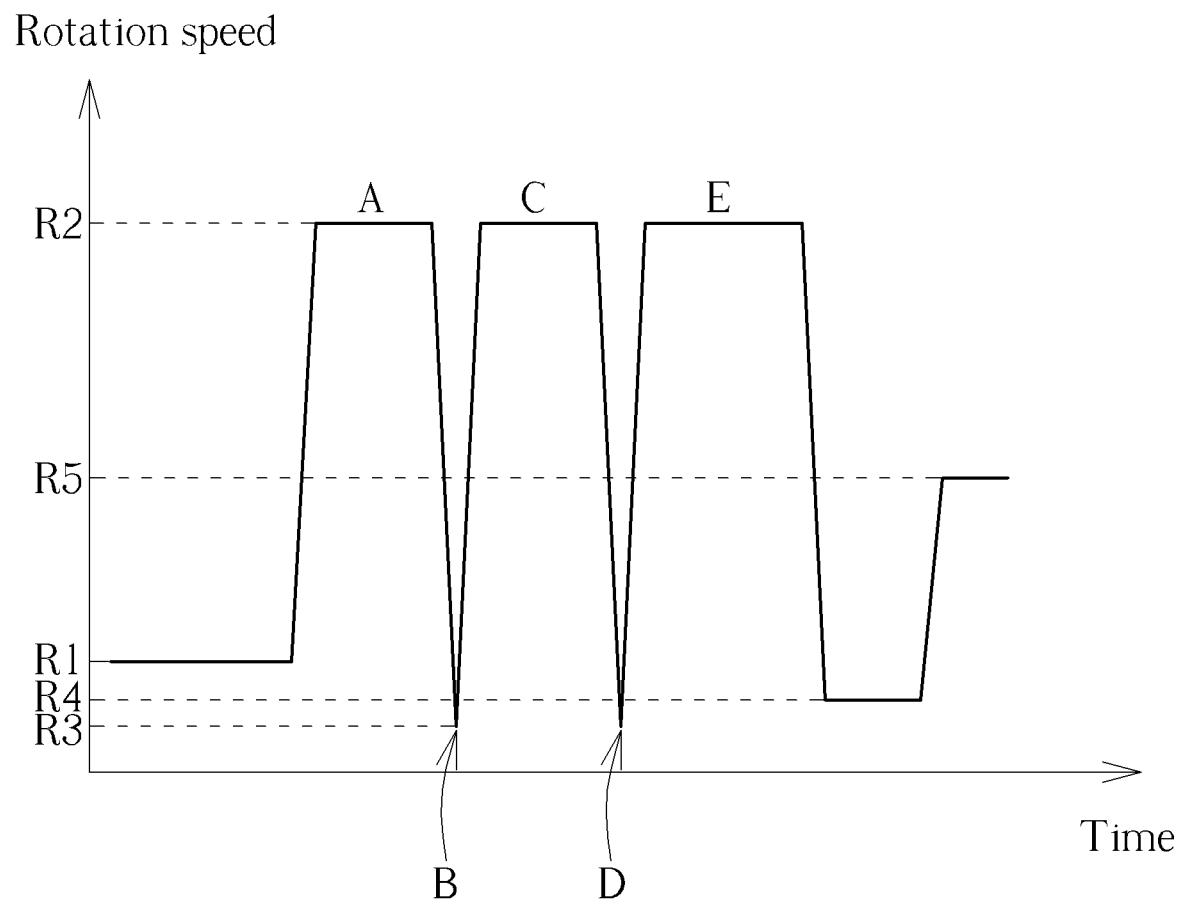
FIG. 2 shows the relationship between rotation speed and time in the photoresist coating method provided by the present invention.
Figure 3:
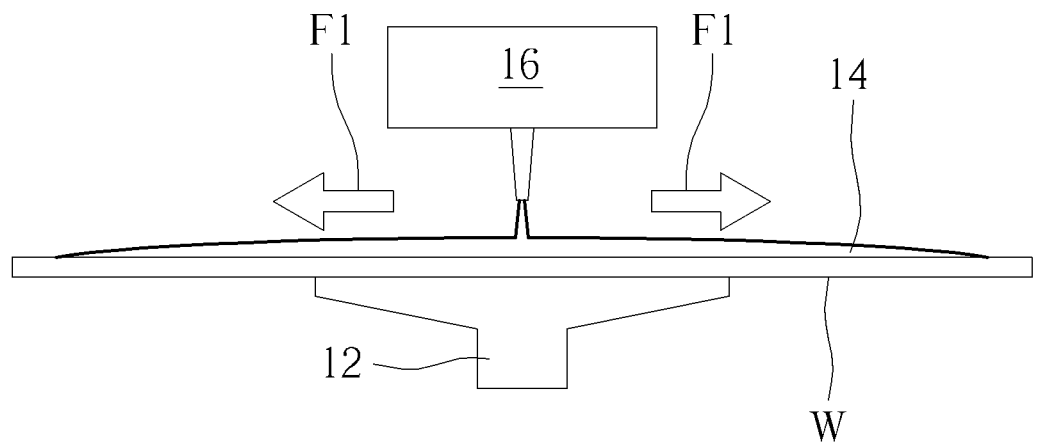
FIG. 3 shows a schematic cross-sectional structure of photoresist coated on the wafer in stage A in FIG. 2.
Figure 4:
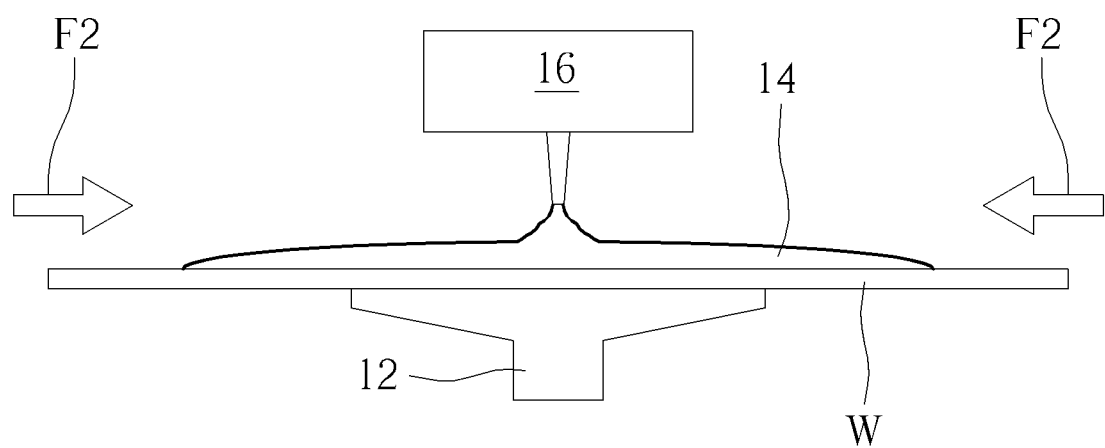
FIG. 4 shows a schematic cross-sectional structure of photoresist coated on the wafer in stage B and stage D in FIG. 2.
Figure 5:
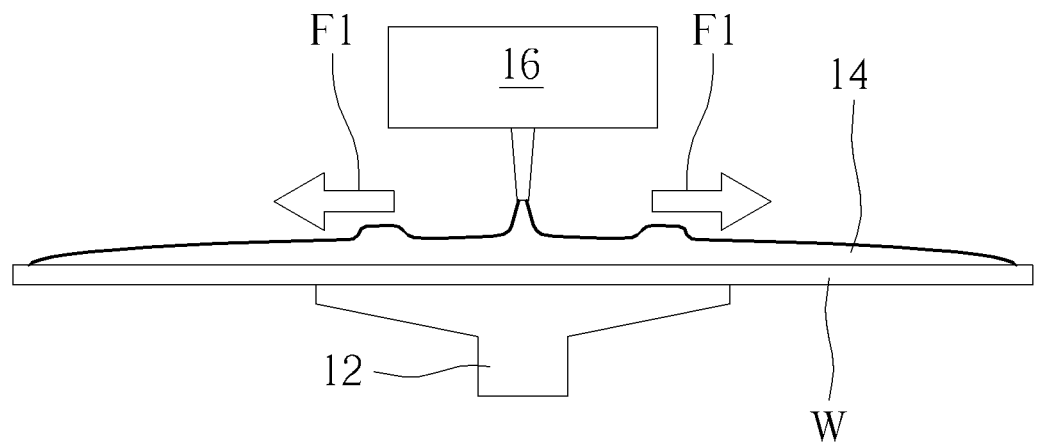
FIG. 5 shows a schematic cross-sectional structure of photoresist coated on the wafer at stage C in FIG. 2.
Figure 6:
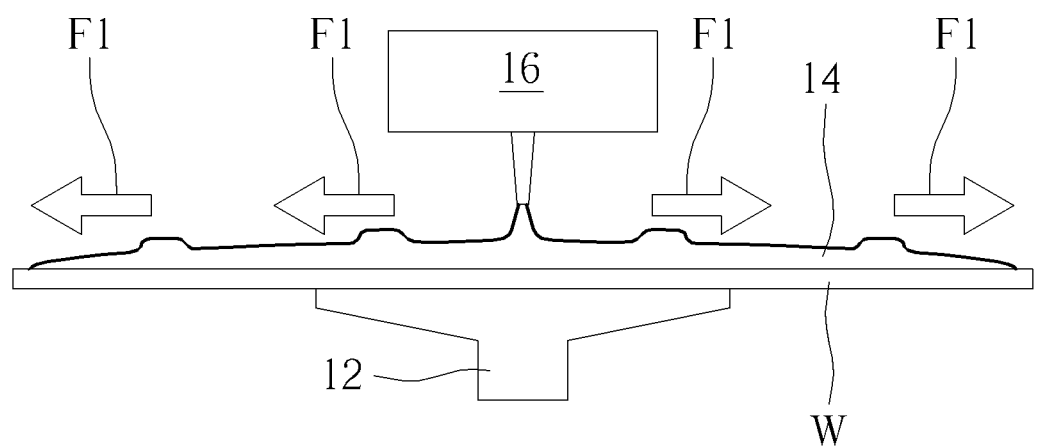
FIG. 6 shows a schematic cross-sectional structure of photoresist coated on the wafer in stage E in FIG. 6.

To solve the above problems, the present invention provides a method of spin coating photoresist on a wafer. FIG. 2 shows the relationship between rotation speed and time in the photoresist coating method provided by the present invention. FIG. 3 shows a schematic cross-sectional structure of photoresist coated on the wafer in stage A in FIG. 2. FIG. 4 shows a schematic cross-sectional structure of photoresist coated on the wafer in stage B and stage D in FIG. 2. FIG. 5 shows a schematic cross-sectional structure of photoresist coated on the wafer at stage C in FIG. 2. FIG. 6 shows a schematic cross-sectional structure of photoresist coated on the wafer in stage E in FIG. 6.

As shown in FIG. 2, in the photoresist coating method of the present invention, photoresist (liquid or solution) is sprayed or injected on the center of the wafer, and then the wafer starts to rotate. In the process of rotation, the first rotation speed R1 is a low rotation speed, for example, 100-600 rpm. Here, the purpose of starting from the lower first rotation speed R1 is to take a preliminary step to test whether the wafer is completely fixed on a photoresist spin coater, and if the wafer is not tightly fixed, the process can be stopped immediately. At the first rotation speed R1, the wafer is not rotated to a high speed, so most of the photoresist has not been pushed out to the periphery of the wafer.

Then, the rotation speed is increased to the second rotation speed R2 (such as the stage A in FIG. 2), and the second rotation speed is a high rotation speed, such as 1500-4000 rpm. The main purpose of this step is to spread the photoresist outwards and distribute it to the whole wafer. Meanwhile, please refer to FIG. 3, the wafer W is fixed on a photoresist spin coater) 12, and the photoresist 14 is sprayed near the center of the wafer W by a nozzle 16. When the rotation speed is increased to the second rotation speed R2, the centrifugal force F1 generated by the rotation drives the photoresist 14 to diffuse and move towards the periphery of the wafer 10.

It is worth noting that in the process of rotation, there are several times of rapid braking, such as stage B and stage D in FIG. 2. When the wafer is braked, the rotation speed of the wafer will rapidly drop from the second rotation speed R2 (high rotation speed) to a low point, that is, the third rotation speed R3 in FIG. 2, wherein the third rotation speed R3 is lower than the first rotation speed R1, which is about 200 rpm. After rapid braking, the rotation speed of the wafer rises again from the low point (i.e. the third rotation speed R3) to the second rotation speed R2. In addition, during the whole photoresist spin coating process, the above-mentioned rapid braking may be repeated several times (stages B and D), and after each rapid braking, the wafer will return to the high rotation speed (stages C and E) until the photoresist is completely distributed on the whole wafer.

In addition, in the present invention, the time of the above-mentioned rapid braking (stages B and D) is only a moment, that is to say, the wafer does not stay at the low rotation speed (third rotation speed R3) for a period of time, but immediately returns to the high rotation speed (second rotation speed R2) after rapid braking. Therefore, from FIG. 2, in the rotation speed diagram, stage B and stage D present a downward sharp angle. In terms of time, the time spent in stage B or D is less than 1/10 of the time spent in stages A, C and E. The above-mentioned rapid braking step only stays for a short time, so that the photoresist spin coater 12 will have a similar vibration effect due to rapid braking. In addition, when the wafer W drops from a high rotation speed to a low rotation speed in an instant, please refer to FIG. 4, a reverse centrifugal force F2 will be generated, that is, the photoresist 14 will return to the center from the periphery of the wafer W. Then, the rotation speed is increased to the third rotation speed R3 again (such as stages C and E in FIG. 2). At the same time, please refer to FIG. 5, the photoresist returned to the central region of the wafer W is pushed out by the centrifugal force F1 again. The above-mentioned rapid braking is performed several times (such as stages A-E), so that the photoresist 14 can be pushed out from the center region on the wafer W, then back to the center region from the periphery, and then pushed out again. By repeating the above steps, the photoresist 14 can be coated more evenly, and it can also avoid the obstruction of various patterns. For example, the pattern shown in FIG. 1 has a plurality of right-angle continuous arrangements, and all positions of the wafer W can be effectively coated by the method of the present invention.

Then, the rotation speed is reduced from the second rotation speed R2 to the fourth rotation speed R4, the fourth rotation speed R4 is also a low rotation speed, which is lower than the first rotation speed R1, and the fourth rotation speed is about 100-300 rpm. The purpose of the fourth rotation speed R4 here is to slow down the rotation speed of the wafer and prepare to finish the photoresist coating process. In addition, in this embodiment, the ratio between the first rotation speed R1 and the second rotation speed R2 is about 1/10-4/9, and the ratio between the second rotation speed R2 and the third rotation speed is about 8/1-20/1.

In addition, in some embodiments, the rotation speed can be increased again after R4 (for example, the rotation speed reaches R5 shown in FIG. 2) to adjust the thickness of the photoresist layer, and the higher the rotation speed R5, the thinner the photoresist layer will be. In this embodiment, the rotation speed R5 is, for example, 1000-3000 rpm, but the present invention is not limited to this. In addition, the rotation speed R5 is an optional step, so the rotation speed R5 step can be omitted in some embodiments.

It is worth noting that during the above-mentioned process of increasing from the first rotation speed R1 to the second rotation speed R2, then dropping from the second rotation speed R2 to the third rotation speed R3 for several times, then rising to the second rotation speed R2 and finally dropping to the fourth rotation speed R4, the photoresist 14 is continuously sprayed or injected on the central region of the wafer W from the nozzle 16 without stopping. According to the applicant's observation, if the photoresist 14 is continuously sprayed on the central region of the wafer W, when the photoresist 14 is concentrated in the central region due to the rapid braking, more photoresist 14 can be concentrated in the central region. Then, when the rotation speed is increased to the second rotation speed R2 again, these photoresists 14 will generate similar waves and be coated outward, so that the photoresist 14 can be more effectively and uniformly coated.

According to the above description and drawings, the present invention provides a photoresist coating method, which includes providing a wafer W with a pattern 11, placing the wafer W on a photoresist spin coater 12, injecting a photoresist 14 from a nozzle 16 on a central region of the wafer W, and performing a spin coating step. The spin coating step includes: starting the photoresist spin coater 12 to rotate the photoresist spin coater 12 to a first rotation speed R1, the first rotation speed R1 is then increased to a second rotation speed R2, and performing rapid braking several times in the process of maintaining the second rotation speed R2, so that the second rotation speed R2 instantly drops to a third rotation speed R3, and then rises to the second rotation speed R2 again.

In some embodiments of the present invention, the photoresist 14 is uniformly coated on the wafer W after several times of rapid braking, and then the second rotation speed R2 is reduced to a fourth rotation speed R4, wherein the fourth rotation speed R4 is smaller than the first rotation speed R1.

In some embodiments of the present invention, during the process of the photoresist spin coater 12 from the first rotation speed to the fourth rotation speed, the nozzle 16 continuously injects photoresist 14 on the central region of the wafer W.

In some embodiments of the present invention, the third rotation speed R3 is smaller than the first rotation speed R1 and the fourth rotation speed R4.

In some embodiments of the present invention, during the spin coating step, the total time staying at the third rotation speed R3 is less than 1/10 of the total time staying at the second rotation speed R2.

In some embodiments of the present invention, when the rotation speed R1 is increased to the second rotation speed R2, the photoresist 14 spreads from the central region of the wafer W to an edge region (periphery region) of the wafer W.

In some embodiments of the present invention, when the rotation speed R2 is reduced to the third rotation speed R3, the photoresist 14 converges from the edge region of the wafer W to the central region of the wafer W.

In some embodiments of the present invention, an area of the pattern 11 accounts for more than 60% of a total area of the wafer W.

In some embodiments of the present invention, the pattern 11 includes a plurality of right-angled patterns, and the right-angled patterns are aligned with each other along a direction D1.

In some embodiments of the present invention, the pattern 11 includes a plurality of grooves or holes, and an aspect ratio of at least a part of the grooves or holes is greater than 10.

The invention is characterized in that when the photoresist is spin-coated, the photoresist is deliberately moved like a wave by changing the rotation speed, which can greatly solve the problem that the photoresist cannot cover some areas of the wafer. Especially for some patterns with special shapes (such as continuous right-angled wires, etc.), the uniformity of photoresist coating process can be greatly increased. In the prior art, when photoresist is coated on a complex pattern, it is difficult to completely cover the whole wafer surface even if the photoresist injecting amount is increased. By the method provided by the invention, the photoresist can completely cover the whole wafer across obstacles without increasing the photoresist injecting amount, and the yield of photoresist spin coating is effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A photoresist coating method, comprising:
providing a wafer, wherein a pattern is disposed on the wafer;
placing the wafer on a photoresist spin coater, and a photoresist is injected on a central region of the wafer from a nozzle;
performing a spin coating step, wherein the spin coating step including: turning on the photoresist spin coater to rotate the photoresist spin coater to a first rotation speed, raising the first rotation speed to a second rotation speed, and performing braking several times in the process of maintaining the second rotation speed, so that the second rotation speed drops to a third rotation speed, and then rises to the second rotation speed again, wherein the rotation speed does not decrease below the third rotation speed prior to returning to the second rotation speed, and wherein during the spin coating step, the total time staying at the third rotation speed is less than 1/10 of the total time staying at the second rotation speed, wherein a reverse centrifugal force is generated and the photoresist converges from an edge region of the wafer to the central region of the wafer during the braking from the second rotation speed to the third rotation speed.

2. The photoresist coating method according to claim 1, wherein the photoresist is coated on the wafer after the braking, and then the second rotation speed is reduced to a fourth rotation speed, wherein the fourth rotation speed is smaller than the first rotation speed.

3. The photoresist coating method according to claim 2, wherein the nozzle continuously injects the photoresist on the central region of the wafer during the process of the photoresist spin coater from the first rotation speed to the fourth rotation speed.

4. The photoresist coating method according to claim 2, wherein the third rotation speed is smaller than the first rotation speed and the fourth rotation speed.

5. The photoresist coating method according to claim 1, wherein when the first rotation speed is increased to the second rotation speed, the photoresist spreads from the central region of the wafer to the edge region of the wafer.

6. The photoresist coating method according to claim 1, wherein an area of the pattern accounts for more than 60% of a total area of the wafer.

7. The photoresist coating method according to claim 6, wherein the pattern includes a plurality of right-angle patterns, and each right-angle pattern is aligned with each other in one direction.

8. The photoresist coating method according to claim 6, wherein the pattern includes a plurality of grooves or holes, and an aspect ratio of at least a part of the grooves or holes is greater than 10.

* * * * *